United States Patent
Wang et al.

(10) Patent No.: US 11,374,081 B2
(45) Date of Patent: Jun. 28, 2022

(54) ORGANIC LIGHT EMITTING DIODE FLEXIBLE ARRAY SUBSTRATE WITH SIGNAL LINES IN DIFFERENT WIDTHS

(71) Applicant: WUHAN CHINA STAR OPTOELECTRONICS SEMICONDUCTOR DISPLAY TECHNOLOGY CO., LTD., Hubei (CN)

(72) Inventors: Wei Wang, Wuhan (CN); Pinquan Xu, Wuhan (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 264 days.

(21) Appl. No.: 16/481,109

(22) PCT Filed: Apr. 29, 2019

(86) PCT No.: PCT/CN2019/084990
§ 371 (c)(1),
(2) Date: Jul. 26, 2019

(87) PCT Pub. No.: WO2020/151123
PCT Pub. Date: Jul. 30, 2020

(65) Prior Publication Data
US 2021/0335975 A1    Oct. 28, 2021

(30) Foreign Application Priority Data
Jan. 25, 2019    (CN) .......................... 201910072275.9

(51) Int. Cl.
*H01L 27/32* (2006.01)
*G09F 9/30* (2006.01)
*H01L 51/00* (2006.01)

(52) U.S. Cl.
CPC .......... *H01L 27/3276* (2013.01); *G09F 9/301* (2013.01); *H01L 27/3246* (2013.01); *H01L 51/0097* (2013.01)

(58) Field of Classification Search
CPC ............. H01L 27/3276; H01L 27/3246; H01L 51/0097
(Continued)

(56) References Cited

U.S. PATENT DOCUMENTS

2015/0055077 A1    2/2015 Yoon et al.
2016/0225907 A1*   8/2016 Kim .................... H01L 27/3276
(Continued)

FOREIGN PATENT DOCUMENTS

CN    107331686 A    11/2017
CN    107479752 A    12/2017
(Continued)

*Primary Examiner* — Xia L Cross

(57) ABSTRACT

The present invention discloses an organic light emitting diode flexible array substrate including a displaying region, a folding region adjacent to the displaying region, a flexible substrate, barrier layer, a buffer layer, a polycrystalline layer stacked together, a first insulation layer disposed on the buffer layer and covering the polycrystalline layer, a first metal layer, a second metal layer, and a third metal layer. Folding signal lines are formed on a portion of the second metal layer in the folding region. Folding signal lines are formed on a portion of the third metal layer in the folding region. Double folding signal lines of the second metal layer and third metal layer drastically increase reliability and lifespan of the signal lines in the folding region.

4 Claims, 4 Drawing Sheets

(58) Field of Classification Search
USPC .......................................................... 257/40
See application file for complete search history.

(56) References Cited

U.S. PATENT DOCUMENTS

| | | | |
|---|---|---|---|
| 2017/0170206 A1 | 6/2017 | Lee et al. | |
| 2017/0294425 A1* | 10/2017 | Kim | H01L 51/0097 |
| 2018/0040680 A1* | 2/2018 | Cai | H01L 51/0097 |
| 2018/0062105 A1* | 3/2018 | Lius | H01L 27/1251 |
| 2019/0115407 A1* | 4/2019 | Cho | H01L 27/3262 |

FOREIGN PATENT DOCUMENTS

| | | |
|---|---|---|
| CN | 107728396 A | 2/2018 |
| CN | 109065575 A | 12/2018 |

* cited by examiner

ORGANIC LIGHT EMITTING DIODE FLEXIBLE ARRAY SUBSTRATE WITH SIGNAL LINES IN DIFFERENT WIDTHS

FIELD OF INVENTION

The present invention relates to a flexible array substrate, especially to an organic light emitting diode flexible array substrate drastically improves reliability and lifespan of folding region signal lines.

BACKGROUND OF INVENTION

A flexible display panel has folding capability, can be well installed on each of various curved surface of an article, and therefore receives the attention of the public.

A conventional flexible display panel employs a soft and pliable plastic substrate, and is suitable for manufacture of narrow bezel display devices. The reason is that a non-displaying region 92 on a periphery of the flexible display panel can be curved or bent to be set on a side or a lower side of the screen to reduce a proportion of the non-displaying region 92 on a front to achieve a design of the narrow bezel.

With reference to FIGS. 1 and 2, a conventional flexible display panel includes a flexible substrate 90, a displaying region (Active Area, AA) 91 disposed on the flexible substrate 90 and a non-displaying region 92 disposed on a periphery of the displaying region 91. Furthermore, a folding region 921 and a chip disposing region 922 are formed on the non-displaying region 92. A drive chip 93 is disposed in the chip disposing region 922. The folding region 921 serves as a signal wiring region, signal lines are disposed in the folding region 921 to connect the displaying region 91 and the drive chip 93. Because the signal lines are made directly on the flexible substrate 90, the flexible circuit plate may be omitted. Furthermore, the signal wiring region and the chip disposing region 922 is folded and disposed on a side or a bottom of the displaying region 91 through the folding region 921. Therefore, a design of the narrow bezel is achieved.

However, the signal lines of the above folding region 921 easily ruptures or has cracks due to folding stress. Furthermore, a folding status of the folding region results in increase of the resistance and even broken lines, which causes display errors.

Therefore, it is necessary to provide an organic light emitting diode flexible array substrate to solve the technical issue of the prior art.

SUMMARY OF INVENTION

Technical Issue

According to the technical issue that signal lines of a folding region of the conventional flexible display panel easily ruptures or has cracks due to folding stress, the present invention provides an organic light emitting diode flexible array substrate solve the technical issue of the prior art.

Technical Solution

A main objective of the present invention is to provide an organic light emitting diode flexible array substrate, including:

a flexible substrate located in the displaying region and the folding region;

a barrier layer disposed on the flexible substrate and located in the displaying region;

a buffer layer disposed on the barrier layer and located in the displaying region;

a polycrystalline layer disposed on the buffer layer and located in the displaying region;

a first insulation layer disposed on the buffer layer, covering the polycrystalline layer, and located in the displaying region;

a first metal layer disposed in the first insulation layer and located in the displaying region;

a second insulation layer disposed above the first metal layer;

a second metal layer disposed in the first insulation layer and located in the displaying region and the folding region, wherein a plurality of folding signal lines are formed on a portion of the second metal layer in the folding region;

a third insulation layer located above the second metal layer, wherein the third insulation layer at least comprises an organic material and an inorganic insulating material; and a third metal layer disposed above the first insulation layer and located in the displaying region and the folding region, wherein a plurality of folding signal lines are formed on a portion of the third metal layer in the folding region.

In an embodiment of the present invention, a lower capacitor electrode plate and a plurality of flattened signal lines are formed on the portion of the second metal layer in the displaying region.

In an embodiment of the present invention, a width of each of the flattened signal lines of the second metal layer is less than a width of each of the folding signal lines of the second metal layer.

In an embodiment of the present invention, an interval of adjacent two of the flattened signal lines of the second metal layer is less than an interval of adjacent two of the folding signal lines of the second metal layer.

In an embodiment of the present invention, an upper capacitor electrode plate and a plurality of flattened signal lines are formed on the portion of the third metal layer in the displaying region, and the upper capacitor electrode plate corresponds to the lower capacitor electrode plate.

In an embodiment of the present invention, a width of each of the flattened signal lines the third metal layer is less than a width of each of the folding signal lines of the third metal layer.

In an embodiment of the present invention, an interval of adjacent two of the flattened signal lines of the third metal layer is less than an interval of adjacent two of the folding signal lines of the third metal layer.

In an embodiment of the present invention, signal lines are formed on the first metal layer.

In an embodiment of the present invention, the organic light emitting diode flexible array substrate further comprises at least one planarization layer, and the planarization layer is disposed above the first insulation layer and is located in the displaying region and the folding region; the organic light emitting diode flexible array substrate further comprises a pixel definition layer, the pixel definition layer is disposed above planarization layer and is located in the displaying region and the folding region; and the organic light emitting diode flexible array substrate further comprises an anode layer, the anode layer is disposed above the planarization layer, is located in the displaying region, and electrically contacts the third metal layer through via holes.

Another objective of the present invention is to provide an organic light emitting diode flexible array substrate, including:

a displaying region and a folding region located adjacent to the displaying region;

a flexible substrate located in the displaying region and the folding region;

a barrier layer disposed on the flexible substrate and located in the displaying region;

a buffer layer disposed on the barrier layer and located in the displaying region;

a polycrystalline layer disposed on the buffer layer and located in the displaying region;

a first insulation layer disposed on the buffer layer, covering the polycrystalline layer, and located in the displaying region;

a first metal layer disposed in the first insulation layer and located in the displaying region;

a second insulation layer disposed above the first metal layer;

a second metal layer disposed in the first insulation layer and located in the displaying region and the folding region, wherein a plurality of folding signal lines are formed on a portion of the second metal layer in the folding region;

a third insulation layer located above the second metal layer, wherein the third insulation layer at least comprises an organic material and an inorganic insulating material; and a third metal layer disposed above the first insulation layer and located in the displaying region and the folding region, wherein a plurality of folding signal lines are formed on a portion of the third metal layer in the folding region;

wherein a lower capacitor electrode plate and a plurality of flattened signal lines are formed on the portion of the second metal layer in the displaying region.

wherein a width of each of the flattened signal lines of the second metal layer is less than a width of each of the folding signal lines of the second metal layer.

wherein an interval of adjacent two of the flattened signal lines of the second metal layer is less than an interval of adjacent two of the folding signal lines of the second metal layer.

In an embodiment of the present invention, a width of each of the flattened signal lines the third metal layer is less than a width of each of the folding signal lines of the third metal layer.

In an embodiment of the present invention, an interval of adjacent two of the flattened signal lines of the third metal layer is less than an interval of adjacent two of the folding signal lines of the third metal layer.

In an embodiment of the present invention, signal lines are formed on the first metal layer.

Advantages

1. The present invention disposes the folding signal lines of the second metal layer and the third metal layer in the folding region, which may increase strength and reliability of the signal lines in the folding region.

2. The folding signal lines of the second metal layer and third metal layer extend respectively from the lower capacitor electrode plate and the upper capacitor electrode plate in the displaying region, instead of additional metal layers, therefore only one yellow light etching process is required to for simultaneously manufacturing the lower capacitor electrode plate, the upper capacitor electrode plate and the second metal layer and third metal layer. Thus, the present invention can achieve double layers of signal lines of the folding region without an additional process.

3. The folding signal lines of the second metal layer and the third metal layer in the folding region, compared to the flattened signal lines in the displaying region, adequately increases a width of the lines and an interval between the lines, which makes the folding region obtain better anti-folding effect.

To make the present invention clear and more understandable, the preferred embodiments with accompany drawings will be described as follows.

DETAILED DESCRIPTION OF PREFERRED EMBODIMENTS

Figure 1:
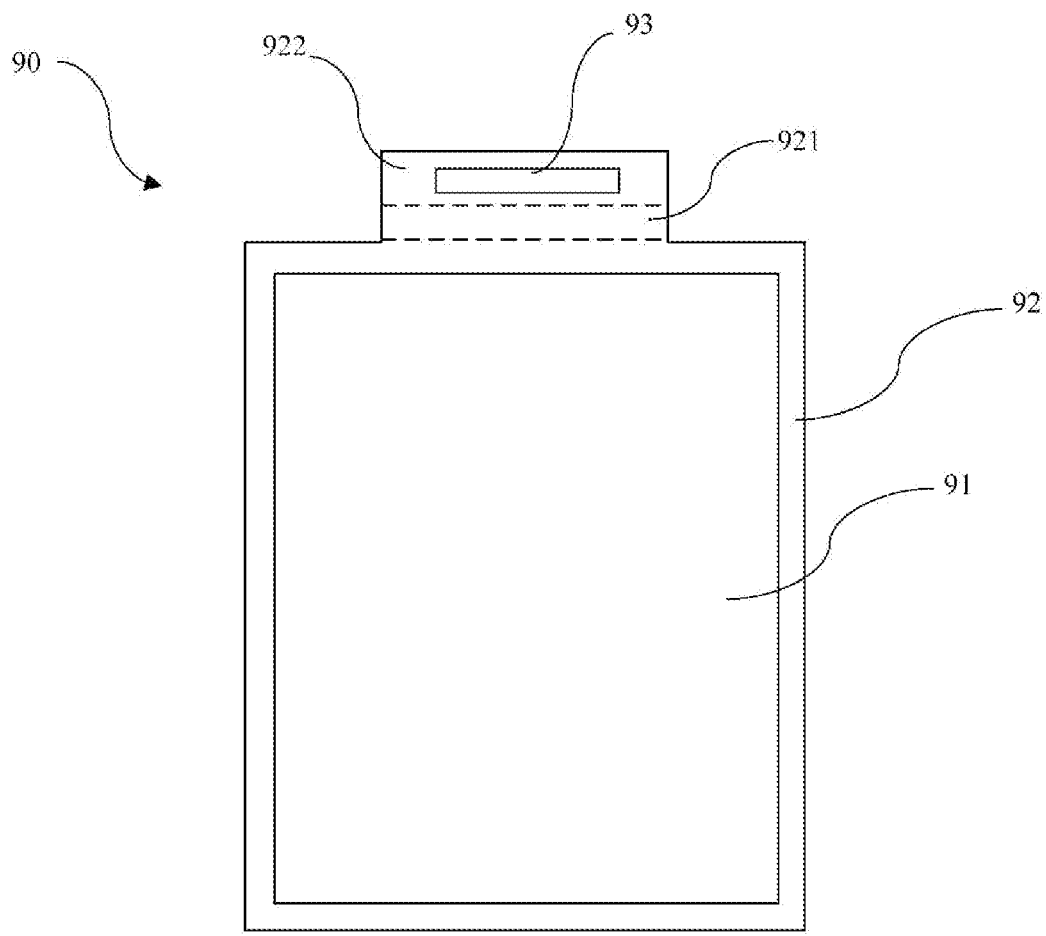
FIG. 1 is a top view of a conventional flexible display panel.
Figure 2:
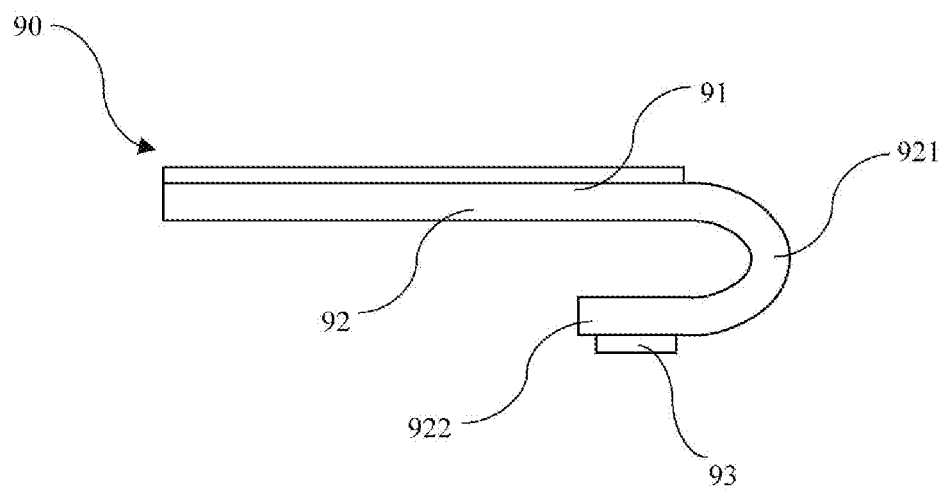
FIG. 2 is a side view of the conventional flexible display panel in FIG. 1.
Figure 3:
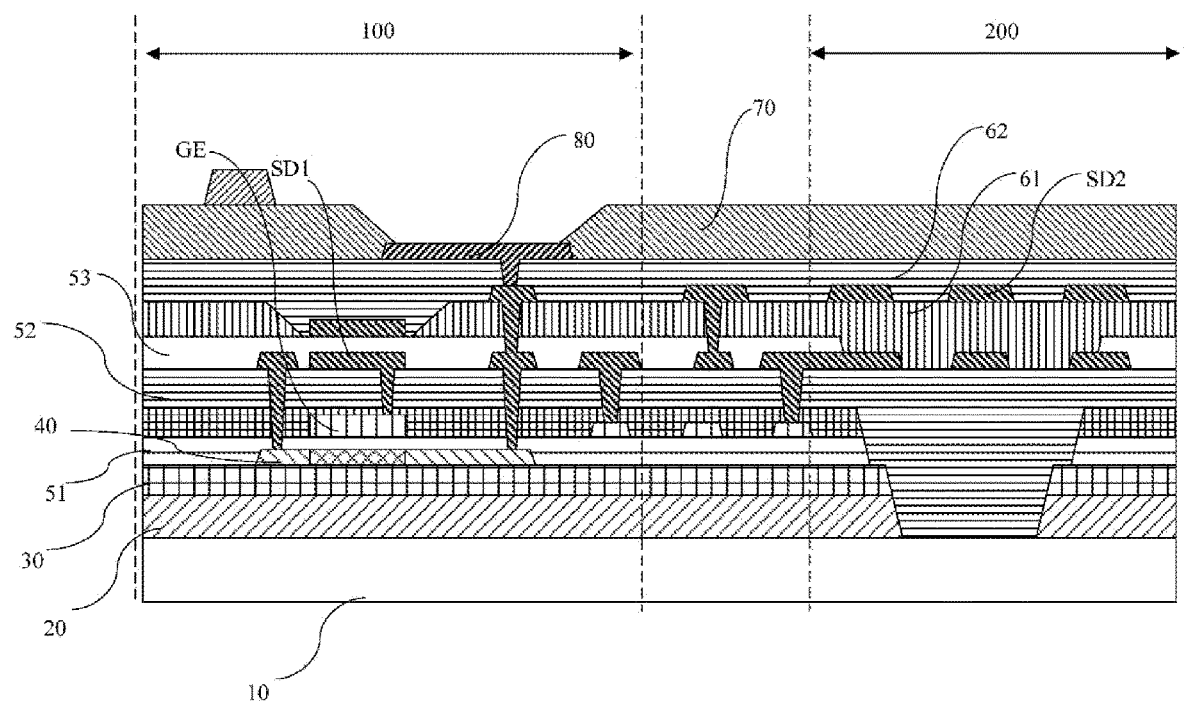
FIG. 3 is a cross-sectional side view of an organic light emitting diode flexible array substrate of a first embodiment of the present invention.

With reference to FIG. 3, an organic light emitting diode flexible array substrate of a first embodiment of the present invention includes a displaying region 100, a folding region 200 located adjacent to the displaying region 100, a flexible substrate 10, a barrier layer 20, a buffer layer 30, a polycrystalline layer 40, a first insulation layer 51, a first metal layer GE, a second insulation layer 52, a second metal layer SD1, a third insulation layer 53, a third metal layer SD2, at least one planarization layer 61, 62, a pixel definition layer 70, and an anode layer 80.

The flexible substrate 10 is located in the displaying region 100 and the folding region 200. Furthermore, the flexible substrate 10 is made of polyimide.

The barrier layer 20 is disposed on the flexible substrate 10 and is located in the displaying region 100.

The buffer layer 30 is disposed on the barrier layer 20 and is located in the displaying region 100.

The polycrystalline layer 40 is disposed on the buffer layer 30 and is located in the displaying region 100 中.

The first insulation layer 51 is disposed on the buffer layer 30, covers the polycrystalline layer 40, and is located in the displaying region 100.

The first metal layer GE is disposed in the first insulation layer 51 and is located in the displaying region 100. Furthermore, signal lines are formed on the first metal layer GE.

The second insulation layer 52 is disposed above the first metal layer GE.

The second metal layer SD1 is disposed in the first insulation layer 51 and is located in the displaying region 100 and the folding region 200. A plurality of folding signal lines W2 are formed on a portion of the second metal layer SD1 in the folding region 200.

The third metal layer SD2 is disposed on the first insulation layer 51 and is located in the displaying region 100 and the folding region 200. A plurality of folding signal lines W2 are formed on a portion of the third metal layer SD2 in the folding region 200.

The planarization layer 61, 62 is disposed on the first insulation layer 51 and is located in the displaying region 100 and the folding region 200. Furthermore, the planarization layer 61, 62 can be two or more planarization layers 61, 62 stacked sequentially over each other.

The pixel definition layer 70 is disposed on planarization layer 61, 62 and is located in the displaying region 100 and the folding region 200.

The anode layer 80 is disposed on the planarization layer 61, 62, is located in the displaying region 100 and is connected electrically to the third metal layer SD2 through a vial holes.

Figure 4:
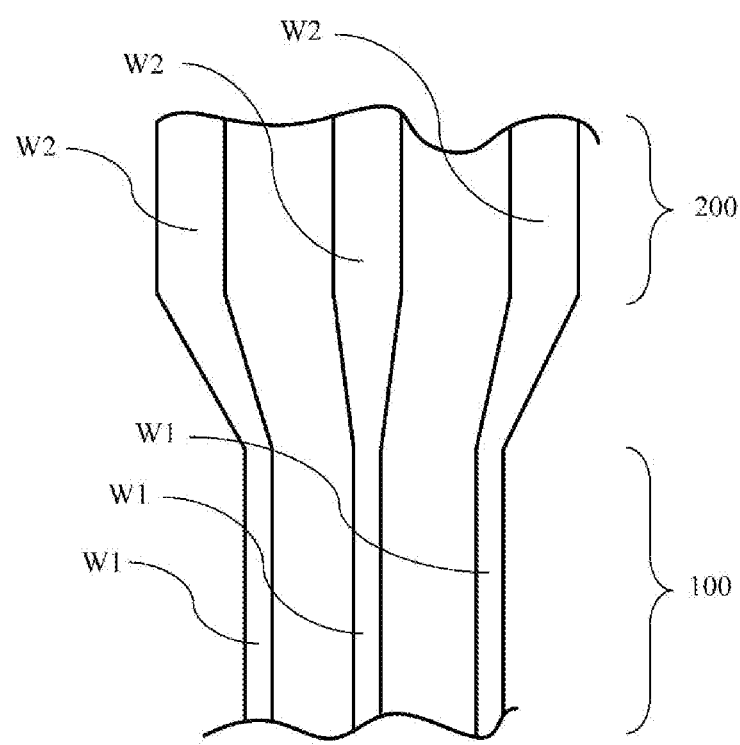
FIG. 4 is a partially enlarged top view of a second metal layer or a third metal layer of the present invention.

With reference to FIG. 4, In an embodiment of the present invention, a lower capacitor electrode plate and a plurality of flattened signal lines W1 are formed on a portion of the second metal layer SD1 in the displaying region 100. A Width of each of the flattened signal lines W1 of the second metal layer SD1 is less than a width of each of the folding signal lines W2 of the second metal layer SD1. an interval of adjacent two of the flattened signal lines W1 of the second metal layer SD1 is less than an interval of adjacent two of the folding signal lines W2 of the second metal layer SD1.

The third insulation layer 53 is located above the second metal layer. The third insulation layer 53 at least includes an organic material and an inorganic insulating material.

With reference to FIG. 4, In an embodiment of the present invention, an upper capacitor electrode plate and a plurality of flattened signal lines W1 are formed on the portion of the third metal layer SD2 in the displaying region 100. The upper capacitor electrode plate corresponds to the upper capacitor electrode plate. In an embodiment of the present invention, a width of each of the flattened signal lines W1 of the third metal layer SD2 is less than a width of each of the folding signal lines W2 of the third metal layer SD2. In an embodiment of the present invention, an interval of adjacent two of the flattened signal lines W1 of the third metal layer SD2 is less than an interval of adjacent two of the folding signal lines W2 of the third metal layer SD2.

In an embodiment of the present invention, the first insulation layer 51 is an inorganic insulation layer including silicon oxide, silicon nitride, etc. The second insulation layer 52 can be an inorganic film layer located in the flattened region 100. In the folding region 200, the second insulation layer 52 is entirely removed.

In an embodiment of the present invention, first insulation layer 51 an inorganic insulation layer including silicon oxide, silicon nitride, etc. The second insulation layer 52 can be a stacked structure of an organic film layer and an inorganic film layer. The organic film layer is located in the flattened region 100 and the folding region 200. The inorganic film layer is located in the flattened region 100. In the folding region 200, the inorganic film layer is entirely removed.

In an embodiment of the present invention, the third insulation layer 53 is located above the second metal layer SD2. The third insulation layer 53 at least includes an organic film layer and an inorganic film layer. The organic film layer is located in the flattened region 100 and the folding region 200. The inorganic film layer is located in the flattened region 100. In the folding region 200, the inorganic film layer is entirely removed.

Compared to the prior art, the present invention organic light emitting diode flexible array substrate has advantages as follows.

1. The present invention disposes the folding signal lines W2 of the second metal layer SD1 and the third metal layer SD2 in the folding region 200, which can increase strength and reliability of the signal lines in the folding region 200.

2. The folding signal lines W2 of the second metal layer SD1 and third metal layer SD2 extend respectively from the lower capacitor electrode plate and the upper capacitor electrode plate in the displaying region 100, instead of additional metal layers, therefore only one yellow light etching process is required to for simultaneously manufacturing the lower capacitor electrode plate, the upper capacitor electrode plate and the second metal layer SD1 and third metal layer SD2. Thus, the present invention can achieve double layers of signal lines of the folding region 200 without an additional process.

3. The folding signal lines W2 of the second metal layer SD1 and the third metal layer SD2 in the folding region 200, compared to the flattened signal lines in the displaying region 100, adequately increases a width of the lines and an interval between the lines, which makes the folding region 200 obtain better anti-folding effect.

What is claimed is:

1. An organic light emitting diode flexible array substrate, wherein the organic light emitting diode flexible array substrate comprises:
a displaying region and a folding region located adjacent to the displaying region;
a flexible substrate located in the displaying region and the folding region;
a barrier layer disposed on the flexible substrate and located in the displaying region;
a buffer layer disposed on the barrier layer and located in the displaying region;
a polycrystalline layer disposed on the buffer layer and located in the displaying region;
a first insulation layer disposed on the buffer layer, covering the polycrystalline layer, and located in the displaying region;
a first metal layer disposed above the first insulation layer and located in the displaying region;
a second insulation layer disposed above the first metal layer;
a second metal layer disposed above the first insulation layer and located in the displaying region and the folding region, wherein a first plurality of folding signal lines are formed as a portion of the second metal layer in the folding region;
a third insulation layer located above the second metal layer, wherein the third insulation layer at least comprises an organic material and an inorganic insulating material; and
a third metal layer disposed above the first insulation layer and located in the displaying region and the folding region, wherein a second plurality of folding signal lines are formed as a portion of the third metal layer in the folding region;
wherein a lower capacitor electrode plate and a plurality of flattened signal lines are formed as a portion of the second metal layer in the displaying region.
wherein a width of each of the flattened signal lines of the second metal layer is less than a width of each of the folding signal lines of the second metal layer.
wherein an interval of adjacent two of the flattened signal lines of the second metal layer is less than an interval of adjacent two of the folding signal lines of the second metal layer;
wherein each folding signal line in the second metal layer is connected to a corresponding one of the flattened signal lines in the second metal layer through a transition line section with a width increasing gradually from the flattened signal line to the folding signal line.

2. The organic light emitting diode flexible array substrate as claimed in claim 1, wherein a width of each of the flattened signal lines of the third metal layer is less than a width of each of the folding signal lines of the third metal layer.

3. The organic light emitting diode flexible array substrate as claimed in claim 1, wherein an interval of adjacent two of the flattened signal lines of the third metal layer is less than an interval of adjacent two of the folding signal lines of the third metal layer.

4. The organic light emitting diode flexible array substrate as claimed in claim 1, wherein the folding signal lines of the second metal layer are formed on the first metal layer.

\* \* \* \* \*